(12) United States Patent
Nakanishi et al.

(10) Patent No.: US 8,593,887 B2
(45) Date of Patent: Nov. 26, 2013

(54) SEMICONDUCTOR DEVICE HAVING REFERENCE VOLTAGE GENERATING UNIT

(75) Inventors: Jingo Nakanishi, Kanagawa (JP); Issei Kashima, Kanagawa (JP)

(73) Assignee: Renesas Electronics Corporation (JP)

( * ) Notice: Subject to any disclaimer, the term of this patent is extended or adjusted under 35 U.S.C. 154(b) by 225 days.

(21) Appl. No.: 13/181,906

(22) Filed: Jul. 13, 2011

(65) Prior Publication Data

US 2012/0051157 A1    Mar. 1, 2012

(30) Foreign Application Priority Data

Aug. 25, 2010    (JP) .................................. 2010-187971

(51) Int. Cl.
*G11C 5/14*    (2006.01)

(52) U.S. Cl.
USPC .................................................... 365/189.09

(58) Field of Classification Search
USPC .................................................... 365/189.09
See application file for complete search history.

(56) References Cited

U.S. PATENT DOCUMENTS

| 7,200,066 B2 * | 4/2007 | Krenzke et al. ............... 365/226 |
| 2010/0123514 A1 * | 5/2010 | Le et al. ........................ 327/539 |

FOREIGN PATENT DOCUMENTS

JP    2004-013380    1/2004

OTHER PUBLICATIONS

Yuichi Okuda et al., "A Trimming-Free CMOS Bandgap-Reference Circuit with Sub-1-V-Supply Voltage Operation," 2007 Symposium on VLSI Circuits Digest of Technical Papers, pp. 96-97.

* cited by examiner

*Primary Examiner* — Hoai V Ho
*Assistant Examiner* — Tri Hoang
(74) *Attorney, Agent, or Firm* — McDermott Will & Emery LLP (57) ABSTRACT

To prevent the influence of variations in reference voltage until a power source is activated in a semiconductor device including a reference voltage generating circuit that can be adjusted by trimming data.
In a semiconductor device, a reference voltage generating unit generates a first reference voltage adjusted in accordance with trimming data and a second reference voltage that does not depend on the trimming data based on an external power source voltage. A nonvolatile memory operates in accordance with a voltage based on the first reference voltage and stores the trimming data. A power-on reset circuit switches logic levels of a reset signal when the external power source voltage reaches a constant multiple of the second reference voltage at the time of activation of power source. A control circuit causes the reference voltage generating unit to read the trimming data stored in the nonvolatile memory in response to the switching of the logic levels of the reset signal.

3 Claims, 9 Drawing Sheets

FIG. 13

SEMICONDUCTOR DEVICE HAVING REFERENCE VOLTAGE GENERATING UNIT

CROSS-REFERENCE TO RELATED APPLICATION

The disclosure of Japanese Patent Application No. 2010-187971 filed on Aug. 25, 2010 including the specification, drawings and abstract is incorporated herein by reference in its entirety.

BACKGROUND

The present invention relates to a semiconductor device comprising a reference voltage generating circuit.

A reference voltage used inside a semiconductor device is required to be stable and independent of the manufacturing process of the semiconductor device, external power source voltage, and operating temperature. As a circuit to generate a reference voltage, a band-gap reference (BGR) circuit (for example, see Y. Okuda et al., "A trimming-Free CMOS Bandgap-Reference Circuit with Sub-1-V-Supply Voltage Operation", 2007 Symposium on VLSI Circuits Digest of Technical Papers, p. 96-97) is used frequently.

The BGR circuit generates a voltage that does not depend on temperature by adding a voltage having positive temperature dependence and a voltage having negative temperature dependence at an appropriate ratio. In order to fine-adjust the addition ratio, a trimming resistor circuit is provided in the BGR circuit.

As a method of trimming a resistor circuit, a method of physically performing trimming by using a laser fuse etc. and a method of performing trimming by software are known. In the method that uses software, a trimming code is stored in advance in a nonvolatile semiconductor memory that can be rewritten electrically and when a semiconductor device is initialized, a resistance value of the resistor circuit is set according to the trimming code read from the memory.

PATENT DOCUMENT 1

Patent Document 1

Japanese Patent Laid-Open No. 2004-133800

SUMMARY

However, when the power source voltage is activated, the nonvolatile memory does not operate normally, and thus the value of the trimming codes is indefinite. That is, when the power source is activated, there is a possibility that the trimming code varies from the minimum value to the maximum value of the code value that can be set. As a result of this, there is a possibility that the value of the reference voltage output from a reference voltage generating circuit (for example, the BGR circuit) also varies considerably.

What is problematic in particular is the case where a semiconductor device is provided with a power-on reset circuit configured so as to determine a timing of reset release by comparing the reference voltage with an external power source voltage. In this case, when the value of the reference voltage varies considerably, the timing of reset release also varies considerably. The trimming code is read from the nonvolatile memory based on the timing of reset release, and thus there is a possibility that the trimming code is not set to a normal value.

An object of the present invention is to prevent a semiconductor device comprising a reference voltage generating circuit that can be adjusted by trimming data from being affected by the variations in reference voltage until the power source is activated.

A semiconductor device according to an embodiment of the present invention comprises a reference voltage generating unit, a nonvolatile memory, a power-on reset circuit, and a control circuit. The reference voltage generating unit generates a first reference voltage adjusted according to trimming data and a second reference voltage that does not depend on the trimming data based on an external power source voltage. The nonvolatile memory operates in accordance with the first reference voltage or a voltage based on the first reference voltage and stores the trimming data. The power-on reset circuit switches the logic levels of a reset signal when the external power source voltage reaches a constant multiple of the second reference voltage at the time of activation of power source. The control circuit causes the reference voltage generating unit to read the trimming data stored in the nonvolatile memory in response to the switching of the logic levels of the reset signal.

According to the embodiment described above, the reference voltage generating unit generates the first reference voltage adjusted according to the trimming data and the second reference voltage that does not depend on the trimming data. Then, the timing to switch the logic levels of the reset signal is determined based on the second reference voltage. Consequently, it is possible to prevent the influence of the variations in the first reference voltage until the power source is activated.

DETAILED DESCRIPTION

Hereinafter, embodiments of the present invention will be explained in detail with reference to the drawings. The same symbol is attached to the same or corresponding part and the repeated explanation thereof is omitted.

First Embodiment

Figure 1:
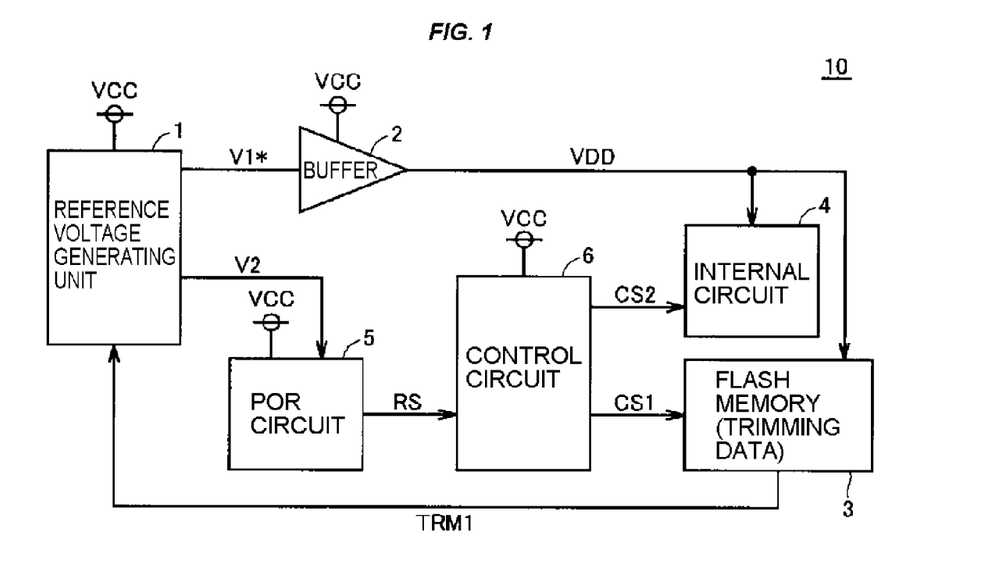
FIG. 1 is a block diagram showing a configuration of a semiconductor device 10 according to a first embodiment of the present invention.

FIG. 1 is a block diagram showing a configuration of a semiconductor device 10 according to a first embodiment of the present invention. Referring to FIG. 1, the semiconductor device 10 is an integrated circuit (IC) including a reference voltage generating unit 1, a buffer circuit 2, a flash memory 3, an internal circuit 4, a power-on reset (POR) circuit 5, and a control circuit 6. When the semiconductor device 10 is a microcomputer, the internal circuit 4 includes a central processing unit (CPU), a RAM (Random Access Memory), a peripheral LSI (Large Scale Integration), etc.

The reference voltage generating unit 1 operates in accordance with an external power source voltage VCC received from outside of the semiconductor device 10 and generates reference voltages V1* and V2. The reference voltage generating unit 1 is designed so that the reference voltages V1* and V2 do not depend on the manufacturing process of the semiconductor device 10, the external power source voltage VCC, and the operating temperature as much as possible.

However, it is hard to avoid a difference between the actual circuit characteristics and the design value from being made, and thus the part of the reference voltage generating unit 1 which relates to the generation of the reference voltages V1 has a circuit configuration that can be adjusted by a trimming code TRM1 and here, a resistor element is used for adjustment. It is also possible to use a MOS (Metal Oxide Semiconductor) transistor in place of a resistor element. After the semiconductor device 10 is manufactured, the trimming code TRM1 is determined according to the actual circuit characteristics and stored in the flash memory 3. The resistance value of the resistor circuit is set by the trimming code TRM1 read from the flash memory 3 at the time of initialization of the semiconductor device 10. As a result of this, it is possible to adjust the reference voltage V1* so as to not depend on the manufacturing process, the external power source voltage, or the operating temperature ("*" at the end of the reference voltages V1* represents that it is adjusted by the trimming code).

On the other hand, for the circuit part relating to the generation of the reference voltage V2, adjustment by the trimming code TRM1 is not made and the reference voltage V2 is a voltage that does not depend on the trimming code TRM1. A specific circuit example of the reference voltage generating unit 1 is explained in FIG. 3.

The buffer circuit 2 operates in accordance with the external power source voltage VCC and generates and outputs an internal power source voltage VDD having the same magnitude as the input reference voltage V1*. The buffer circuit 2 is provided in order to increase the amount of electric current supplied to the flash memory 3 and the internal circuit 4 in the next stage.

The flash memory 3 is a nonvolatile semiconductor memory in which trimming data including the trimming code TRM1 is written in advance and operates in accordance with the internal power source voltage VDD. When an up-converted voltage, which is the up-converted internal power source voltage VDD, is generated in the circuit as in the flash memory 3, the up-converted voltage differs considerably depending on a slight deviation from the set value of the internal power source voltage VDD. In particular, when the up-converted voltage is too high, the deterioration in the gate insulating film is caused when data is written or deleted. Consequently, the precision of the internal power source voltage VDD supplied to the flash memory 3 is very important.

It is possible to use a nonvolatile memory such as an MRAM (Magnetoresistive Random Access Memory) in place of the flash memory 3. When the semiconductor device 10 is a microcomputer, the flash memory 3 may be configured as a ROM (Read Only Memory) that stores programs besides the trimming data.

The POR circuit 5 outputs a reset signal RS according to the external power source voltage VCC when the power source is activated. In the case of FIG. 1, when the external power source voltage VCC is smaller than a predetermined multiple of the reference voltage V2, the reset signal RS is at the low (L) level (reset state) and when the external power source voltage VCC becomes larger than the predetermined multiple of the reference voltage V2, the reset signal RS switches to the high (H) level (release of the reset state). A specific example of the POR circuit 5 is explained in FIG. 2.

The control circuit 6 operates in accordance with the external power source voltage VCC and receives the reset signal RS from the POR circuit 5. The control circuit 6 outputs control signals CS1 and CS2, respectively, to the flash memory 3 and the internal circuit 4 based on the timing at which the reset is released. The flash memory 3 outputs the trimming code TRM1 to the reference voltage generating unit 1 in response to the control signal CS1. The internal circuit 4 initializes a register etc. in response to control signal CS2.

Figure 2:
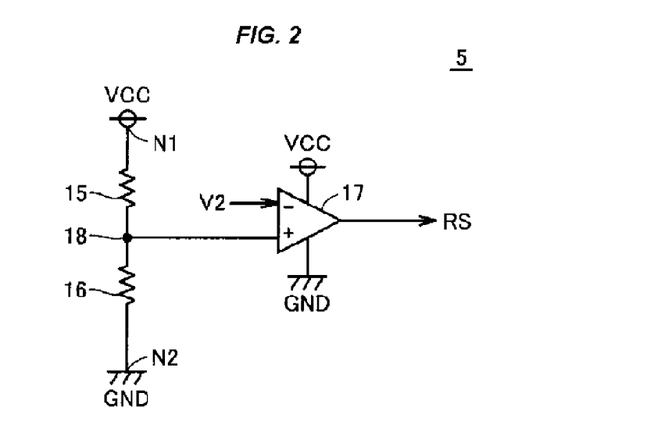
FIG. 2 is a circuit diagram showing an example of a configuration of a POR circuit 5 in FIG. 1.

FIG. 2 is a circuit diagram showing an example of a configuration of the POR circuit 5 in FIG. 1. Referring to FIG. 2, the POR circuit 5 includes resistor elements 15 and 16 and a comparator 17 that operates in accordance with the external power source voltage VCC. The resistor elements 15 and 16 are coupled in series between a power source node N1 that receives the external power source voltage VCC and a ground node N2 that receives a ground voltage GND. The non-inverted input terminal of the comparator 17 is coupled to a coupling node 18 of the resistor elements 15 and 16. To the inverted input terminal of the comparator 17, the reference voltage V2 output from the reference voltage generating unit 1 is input. From the output terminal of the comparator 17, the reset signal RS is output. In the POR circuit 5 with the configuration in FIG. 2, when the detected voltage at the coupling node 18 exceeds the reference voltage V2, the reset signal RS turns to the H level and the reset state is released. Here, the reset state is represented as the L level and the reset released state as the H level, however, it is possible to easily realize the opposite logic by a similar circuit configuration.

Different from that in FIG. 2, a type of POR circuit that generates a reset signal based only on the external power source voltage VCC, not depending on the reference voltage V2, is also known. However, in such a type of POR circuit, the timing at which reset is released is likely to vary depending on the manufacturing process, the external power source voltage VCC, and the operating temperature. By using the POR circuit with the configuration as shown in FIG. 2, which compares the reference voltage V2 with the external power source voltage VCC, it is possible to suppress variations in the timing at which the reset signal is released.

Figure 3:
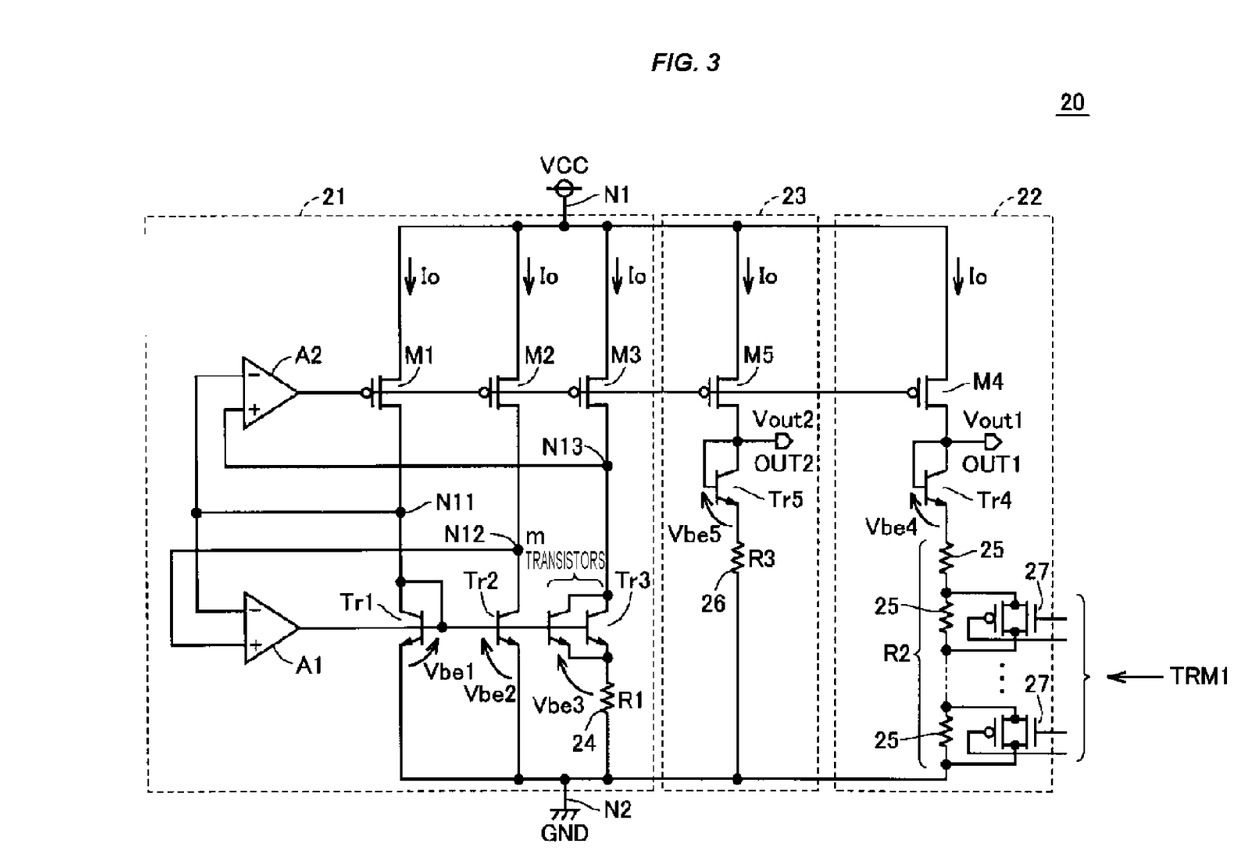
FIG. 3 is a circuit diagram showing an example of a configuration of a reference voltage generating unit 1 in FIG. 1.

FIG. 3 is a circuit diagram showing an example of a configuration of the reference voltage generating unit 1 in FIG. 1. In the case of FIG. 3, the reference voltage generating unit 1 is configured by a band-gap reference (BGR) circuit 20. The BGR circuit 20 is a modification of the circuit disclosed in Non-Patent Document 1 (Y. Okuda et al., "A trimming-Free CMOS Bandgap-Reference Circuit with Sub-1-V-Supply Voltage Operation", 2007 Symposium on VLSI Circuits Digest of Technical Papers, p. 96-97).

Referring to FIG. 3, the BGR circuit 20 includes PMOS (Positive Channel Metal Oxide Semiconductor) transistors M1 to M5, NPN type bipolar transistors Tr1 to Tr5, resistor elements 24 to 26, operational amplifiers A1 and A2, and a plurality of transmission gates 27. The bipolar transistor Tr2 is a transistor in which m bipolar transistors are coupled in parallel. First, coupling between these components is explained.

The transistors M1 and Tr1 are coupled in this order in series between the power source node N1 and the ground node N2. Similarly, the transistors M2 and Tr2 are coupled in this order in series between the nodes N1 and N2 and the transistors M3 and Tr3 and the resistor element 24 are coupled in this order in series between the nodes N1 and N2. The transistors M4 and Tr4 and a plurality of the resistor elements 25 are coupled in this order in series between the nodes N1 and N2 and the transistors M5 and Tr5 and the resistor element 26 are coupled in this order in series between the nodes N1 and N2. The transistors Tr1, Tr4, and Tr5 are diode-coupled transistors in which base and collector are coupled.

The transmission gates 27 are each provided in parallel with at least a part of the resistor elements 25 and the transmission gate 27 and the resistor element 25 corresponding to each other are provided in parallel. Turning on/off of each of the transmission gates 27 is determined according to the trimming code TRM1. Consequently, a resistance value R2 between the emitter of the bipolar transistor Tr4 and the ground node N2 can be varied according to the trimming code TRM1.

The inverted input terminal of the operational amplifier A1 is coupled to a drain (node N11) of the PMOS transistor M1, the non-inverted input terminal is coupled to a drain (node N12) of the PMOS transistor M2, and the output terminal is coupled to the base of the bipolar transistors Tr1 to Tr3. The non-inverted input terminal of the operational amplifier A2 is coupled to a drain (node N13) of the PMOS transistor M3, the inverted input terminal is coupled to the drain (node N11) of the PMOS transistor M1, and the output terminal is coupled to the gate of the PMOS transistors M1 to M5.

Next, the operation of the BGR circuit 20 is explained. In the BGR circuit 20, when the size (ratio W/L between channel width W and channel length) of the PMOS transistors M1 to M5 is the same, an electric current Io (hereinafter, referred to as a reference current Io) that flows through each PMOS transistor is the same. In terms of function, the BGR circuit 20 can be divided into a reference current generating unit 21 that generates the reference current Io and voltage output units 22 and 23 that output a voltage based on the reference current Io.

The reference current generating unit 21 includes the PMOS transistors M1 to M3, the bipolar transistors Tr1 to Tr3, the operational amplifiers A1 and A1, and the resistor element 24. It is assumed that voltages between base and emitter of the bipolar transistors Tr1 and Tr3 are Vbe1, Vbe3, respectively, and a resistance value of the resistor element 24 is R1. The reference current Io is determined by the operational amplifier A2 so that the potential of the drain (node N11) of the PMOS transistor M1 and the potential of the drain (node N13) of the PMOS transistor M3 are the same. The reference current Io satisfies the following relationship $$Vbe1 = Vbe3 + Io \times R1 \qquad (1)$$

From the expression (1), the reference current Io is found as $$Io = (Vbe1 - Vbe3)/R1 \qquad (2)$$

The operational amplifier A1 is provided to suppress the variations in the reference current Io by the offset of the operational amplifier A2.

The voltage output unit 22 includes the PMOS transistor M4, the bipolar transistor Tr4, and the resistor elements 25. The voltage output unit 22 generates a reference voltage Vout1 (corresponding to the reference voltage V1* in FIG. 1) adjusted by the trimming code TRM1 based on the reference current Io and outputs the reference voltage Vout1 that is generated from an output node OUT1 (drain of the PMOS transistor M4). If it is assumed that a voltage between base and emitter of the bipolar transistor Tr4 is Vbe4, the reference voltage Vout1 is obtained by $$Vout1 = Vbe4 + Io \times R2 = Vbe4 + (Vbe1 - Vbe3) \times R2/R1 \qquad (3).$$

In the expression (3), the temperature coefficient of Vbe4 is negative and the temperature coefficient of Vbe1−Vbe3 is (k/q)×ln (m) (here, k is the Boltzmann constant, q is an elementary electric charge, ln is a natural logarithm, and m is the number of parallel couplings of the bipolar transistor Tr3) and positive. Consequently, by adjusting the ratio of resistance value R2/R1, it is possible to adjust the temperature coefficient of the output voltage Vout1 to 0. The resistance value R2 can be adjusted by the trimming code TRM1, and thus it is possible to adjust the temperature coefficient of the output voltage Vout to substantially 0 by adjusting the resistance value R2 even if the temperature coefficient of Vbe4 and the ratio of resistance value R2/R1 deviate from the design values by the influence of the manufacturing process of the semiconductor device.

The voltage output unit 23 includes the PMOS transistor M5, the bipolar transistor Tr5, and the resistor element 26. The voltage output unit 23 generates a reference voltage Vout2 (corresponding to the reference voltage V2 in FIG. 1) that does not depend on the trimming code TRM1 based on the reference current Io and outputs the reference voltage Vout2 that is generated from an output node OUT2 (drain of the PMOS transistor M5). If it is assumed that a voltage between base and emitter of the bipolar transistor Tr5 is Vbe5 and a resistance value of the resistor element 26 is R3, the reference voltage Vout2 is obtained by $$Vout2 = Vbe5 + Io \times R3 = Vbe5 + (Vbe1 - Vbe3) \times R3/R1 \qquad (4).$$

In the expression (4), the temperature coefficient of Vbe5 is negative and the temperature coefficient of Vbe1−Vbe3 is (k/q)×ln (m) and positive as explained in the expression (3). Consequently, by adjusting the ratio of resistance value R3/R1, it is possible to adjust the temperature coefficient of the output voltage Vout1 to 0. However, the resistance value R3 in the expression (4) cannot be adjusted by the trimming code TRM1, and thus it is not possible to completely remove the influence of the variations in the manufacturing process. As a result of this, the precision of the output voltage Vout2 is inferior to the precision of the output voltage Vout1 adjusted by the trimming code TRM1.

Figure 4:
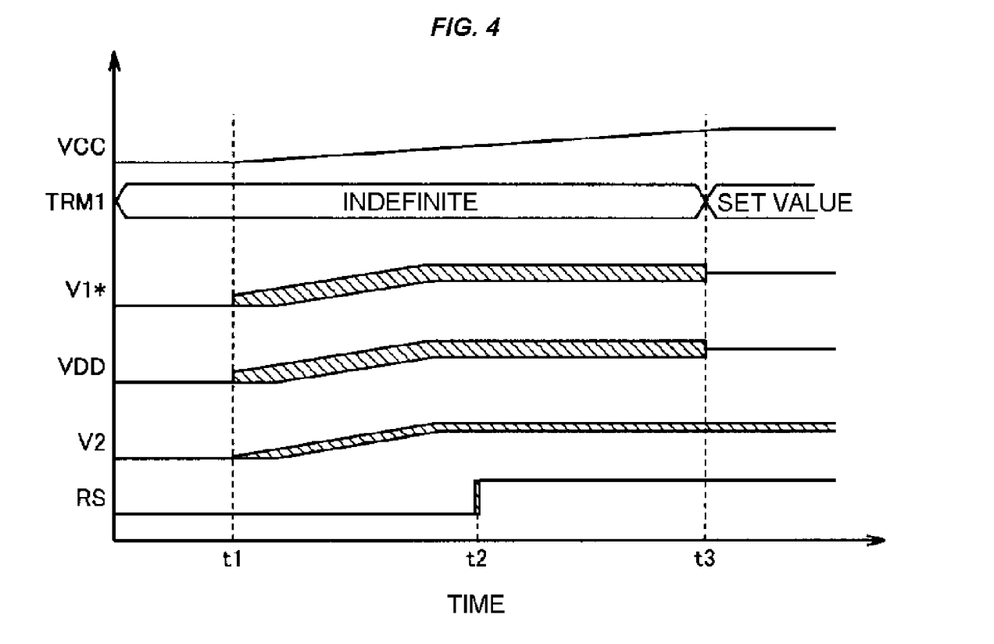
FIG. 4 is a timing chart schematically showing a voltage waveform of each part in FIG. 1.

FIG. 4 is a timing chart schematically showing the voltage waveform of each part in FIG. 1. FIG. 4 shows, in order from the top, the waveform of the external power source voltage VCC in FIG. 1, the waveforms of the trimming code TRM1 and the reference voltage V1*, the waveform of the internal power source voltage VDD, the waveform of the reference voltage V2, and the waveform of the reset signal RS. With reference to FIG. 1 and FIG. 4, the operation of the semiconductor device 10 when the power source is activated is explained below.

When the power source is turned on at time t1 in FIG. 4, the external power source voltage VCC rises gradually from 0 V. In accordance with this, the reference voltages V1*, V2 output from the reference voltage generating unit 1 and the internal power source voltage VDD based on the reference voltage V1* also rise gradually from 0 V. When the power source voltage is activated, the trimming code TRM1 is indefinite. That is, there is a possibility that the trimming code TRM1 varies from the minimum value to the maximum value of the code value that can be set. As a result of this, the values of the reference voltage V1* that depends on the trimming code TRM1 and the internal power source voltage VDD also vary considerably. On the other hand, the reference voltage V2 does not depend on the trimming code TRM1, and thus, although there are variations resulting from the manufacturing process, the variations in the reference voltage V2 are smaller compared to the variations in the reference voltage V1* and the internal power source voltage VDD when the power source is activated. In FIG. 4, the variations in the reference voltages V1* and V2 and the internal power source voltage VDD are represented by hatching.

At the next time t2, when the external power source voltage VCC reaches a predetermined multiple of the reference voltage V2, the POR circuit 5 switches the reset signal RS from the L level to the H level. That is, the reset state is released. The timing at which the reset state is released varies according to the variations in the reference voltage V2. In response to the release of the reset, the control circuit 6 outputs a read signal of trimming data (control signal CS1) after a predetermined time elapses from the timing at which the reset is released (time t2).

At the next time t3, the flash memory 3 outputs the trimming code TRM1 set in advance to the reference voltage generating unit 1 upon receipt of the control signal CS1. After time t3, the reference voltage generating unit 1 generates and outputs the reference voltage V1* based on the trimming code TRM1 set in advance, and thus the variations in the reference voltage V1* and the internal power source voltage VDD resulting from the manufacturing process, the external power source voltage VCC, and the operating temperature become very small. On the other hand, the reference voltage V2 does not depend on the trimming code TRM1, and thus the variations in the reference voltage V2 do not change before and after time t3.

It is assumed that the POR circuit 5 determines the timing at which the reset signal is released by comparing the reference voltage V1* with the external power source voltage VCC. If so, when the trimming code TRM1 is indefinite when the power source voltage is activated, the timing at which reset is released varies considerably by the influence of the variations in the reference voltage V1*. For example, when the reference voltage V1* is lower than the design value, there is a possibility that reset is released before the external power source voltage VCC reaches a voltage level required for the operation of the flash memory 3. On the contrary, when the reference voltage V1* is higher than the design value, there is a possibility that reset is not released because the external power source voltage cannot reach a predetermined multiple of the reference voltage V1*. In particular, when the semiconductor device operates in accordance with a low power source voltage, the margin of the timing at which reset is released becomes smaller, and thus it is likely to be affected by the variations in the reference voltage V1*.

In contrast to the above, in the case of the semiconductor device 10 according to the first embodiment, to the circuit, such as the POR circuit, to which the reference voltage needs to be supplied at the time of activation of power source, the reference voltage V2 that does not depend on the trimming code TRM1 is supplied. To the circuit, such as the flash memory, to which the reference voltage needs to be supplied in a steady state after the activation of power source, the high precision reference voltage V1* adjusted by the trimming code TRM1 is supplied. As a result of this, after the activation of power source, it is made possible to supply the high precision reference voltage adjusted by the trimming code TRM1 and at the same time, it is also possible to prevent the influence of the variations in the reference voltage resulting from the trimming code TRM1 becoming unstable at the time of activation of power source.

In the BGR circuit 20 explained in FIG. 3, to both the voltage output unit 22 that outputs the reference voltage V1* and the voltage output unit 23 that outputs the reference voltage V2, the reference current Io generated by the common reference current generating unit 21 is supplied. Consequently, it is possible to reduce the power consumption as well as the circuit area compared to the case where the BGR circuit to generate the reference voltage V1* and the BGR circuit to generate the reference voltage V2 are provided separately.

Next, modified examples (second to fifth embodiments) of the configuration of the reference voltage generating unit 1 in the semiconductor device 10 in FIG. 1 are explained. In each of the following embodiments, configurations other than the reference voltage generating unit 1 in FIG. 1 are the same as those in FIG. 1, and thus their explanation is not repeated.

Second Embodiment

Figure 5:
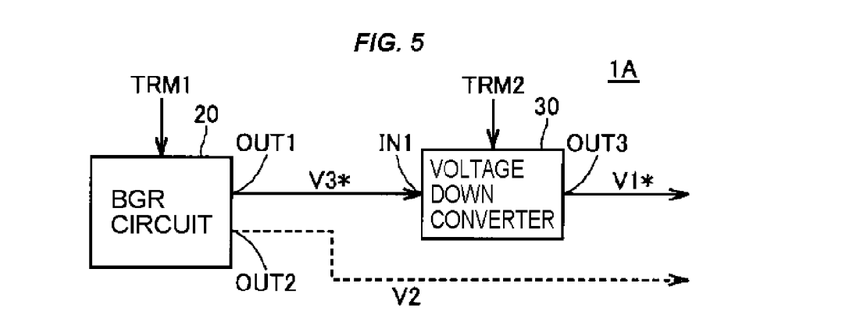
FIG. 5 is a block diagram showing a configuration of a reference voltage generating unit 1A used in a semiconductor device according to a second embodiment of the present invention.

FIG. 5 is a block diagram showing a configuration of a reference voltage generating unit 1A used in a semiconductor device according to a second embodiment of the present invention. Referring to FIG. 5, the reference voltage generating unit 1A includes the BGR circuit 20 that receives the trimming code TRM1 and a voltage down converter 30 (also referred to as a voltage adjusting circuit) that receives a trimming code TRM2. The trimming codes TRM1, TRM2 are stored in advance in the flash memory 3 in FIG. 1 and read from the flash memory 3 according to the control signal SC1 output from the control circuit 6.

The BGR circuit 20 outputs a reference voltage V3* adjusted according to the trimming code TRM1 from the output node OUT1 and at the same time, outputs the reference voltage V2 that does not depend on the trimming code TRM1 from the output node OUT2. The details of the BGR circuit 20 are the same as those in FIG. 3, and thus their explanation is not repeated. The reference voltage V3* that is output is supplied to the voltage down converter 30 and the reference voltage V2 is supplied to the POR circuit 5 in FIG. 1.

The voltage down converter 30 generates the reference voltage V1*, which is the down-converted external power source voltage VCC, and outputs the reference voltage V1* that is generated to the buffer circuit 2 in FIG. 1. The reference voltage V1* is adjusted by the trimming code TRM2 so as to be a constant multiple of the reference voltage V1* input to an input node IN1.

The reference voltage V3* generated by the BGR circuit is adjusted by the trimming code TRM1 so that the temperature coefficient is 0. At this time, the temperature dependence is given priority, and thus there is a case where the value of the reference voltage V3* deviates from the design value. The voltage down converter 30 is provided in order to fine-adjust the deviation of the voltage value.

Figure 6:
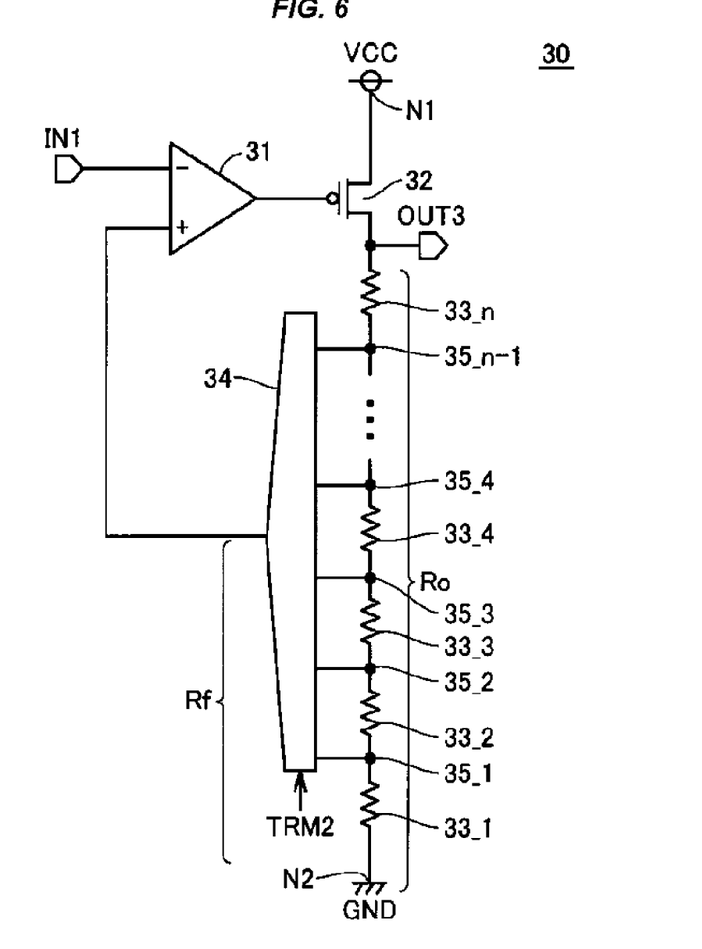
FIG. 6 is a circuit diagram showing an example of a configuration of a voltage down converter 30 in FIG. 5.

FIG. 6 is a circuit diagram showing an example of a configuration of the voltage down converter 30 in FIG. 5. Referring to FIG. 5, FIG. 6, the voltage down converter 30 includes a differential amplifier 31, a PMOS transistor 32, n (n is an integer not less than 3) resistor elements 33_1 to 33_n, and a selection circuit 34. The inverted input terminal of the differential amplifier 31 is coupled to the input node IN1, the non-inverted input terminal is coupled to the output node of the selection circuit 34, and the output terminal is coupled to the gate of the PMOS transistor 32. The source of the PMOS transistor 32 is coupled to the power source node N1 (external power source voltage VCC) and the drain is coupled to an output node OUT3. The resistor elements 33_1 to 33_n are coupled in this order in series between the ground node N2 (ground voltage GND) and the drain of the PMOS transistor 32. The selection circuit 34 outputs the voltage of a node (referred to as a selected node) selected by the trimming code TRM2 from among coupling nodes 35_1 to 35_n of the resistor elements 33_1 to 33_n to the non-inverted input terminal of the differential amplifier 31.

In the voltage down converter 30, if it is assumed that a resistance value between the selected node and the ground node N2 is Rf and a combined resistance value of the resistor elements 33_1 to 33_n coupled in series is Ro, the voltage (reference voltage V1* in FIG. 5) of the output node OUT3 is Ro/Rf times the input voltage (reference voltage V3* in FIG. 5) of the input node IN1. The resistance value Rf can be adjusted by the trimming code TRM2, and thus it is possible to generate the high precision reference voltage V1*.

As described above, with the reference voltage generating unit 1A in FIG. 5, in a steady state after the activation of power source, it is possible to output the high precision reference voltage V1* that hardly depends on the manufacturing process, the external power source voltage VCC, or the operating temperature to the flash memory 3 in FIG. 1. On the other hand, it is possible for the reference voltage generating unit 1A to prevent the influence of the variations in the reference voltage V1* resulting from the trimming codes TRM1, TRM2 becoming indefinite at the time of activation of power source by outputting the reference voltage V2 that does not depend on the trimming code TRM1 or TRM2 to the POR circuit 5 in FIG. 1.

Third Embodiment

Figure 7:
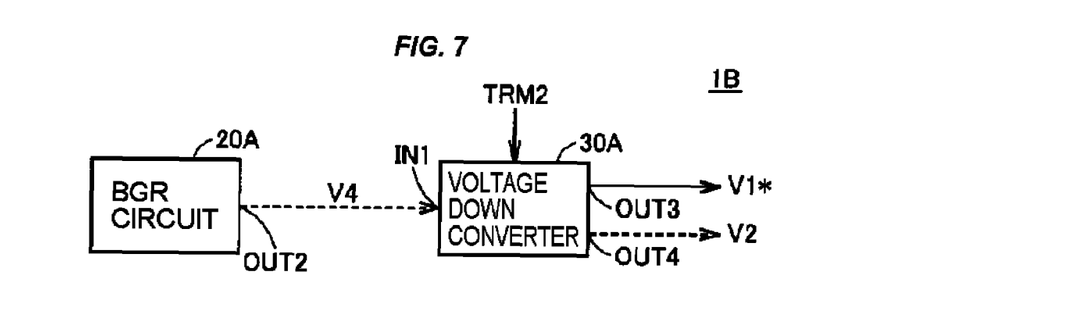
FIG. 7 is a block diagram showing a configuration of a reference voltage generating unit 1B used in a semiconductor device according to a third embodiment of the present invention.

FIG. 7 is a block diagram showing a configuration of a reference voltage generating unit 1B used in a semiconductor device according to a third embodiment of the present invention. Referring to FIG. 7, the reference voltage generating unit 1B includes a BGR circuit 20A that does not depend on the trimming code and a voltage down converter 30A that receives the input of the trimming code TRM2. The trimming code TRM2 is stored in advance in the flash memory 3 in FIG. 1 and read according to the control signal CS1 output from the control circuit 6. It is not possible to fine-adjust the temperature coefficient of the BGR circuit 20A in FIG. 7 by the trimming code, and thus it s suitable for a case where the influence by the manufacturing process of a semiconductor device is slight.

Figure 8:
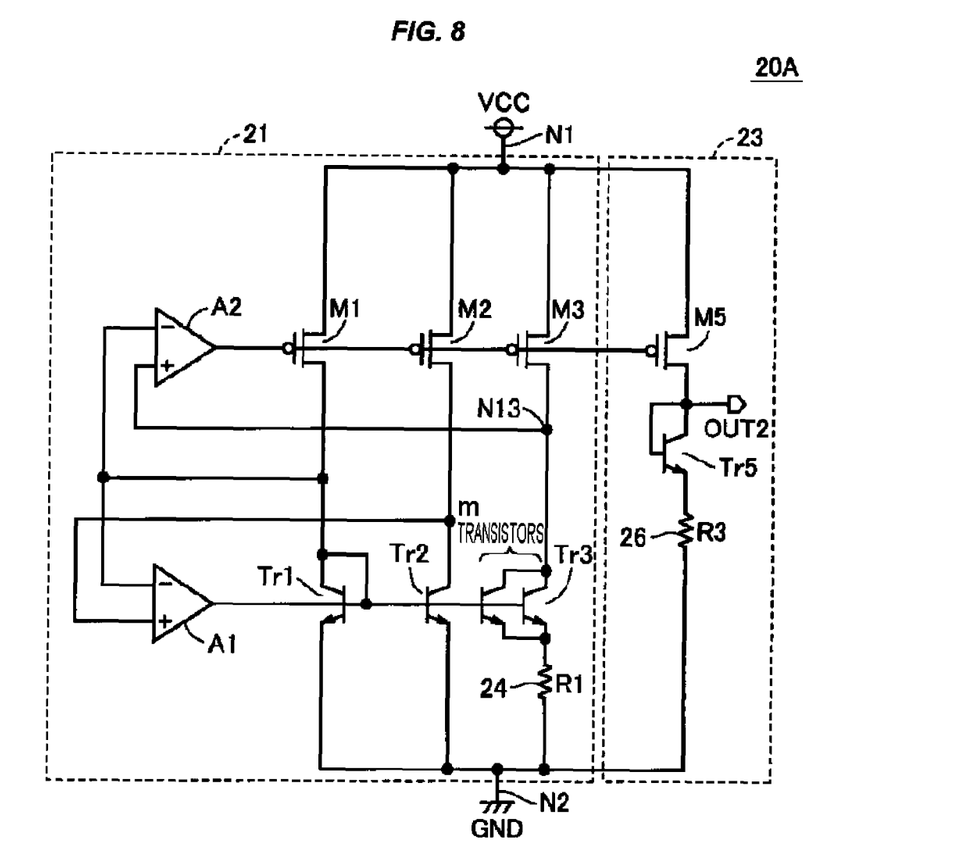
FIG. 8 is a circuit diagram showing a configuration of a BGR circuit 20A in FIG. 7.

FIG. 8 is a circuit diagram showing a configuration of the BGR circuit 20A in FIG. 7. Referring to FIG. 7, FIG. 8, the BGR circuit 20A generates a reference voltage V4 that does not depend on the trimming code and outputs the reference voltage V4 that is generated from the output node OUT2. The configuration of the BGR circuit 20A is the same as that of the BGR circuit 20 in FIG. 3 from which the voltage output unit 22 is removed and includes the reference current generating unit 21 and the voltage output unit 23. As for the reference current generating unit 21 and the voltage output unit 23 in FIG. 8, the same reference symbols are attached to the same or corresponding parts as those in FIG. 3 and their explanation is not repeated.

Figure 9:
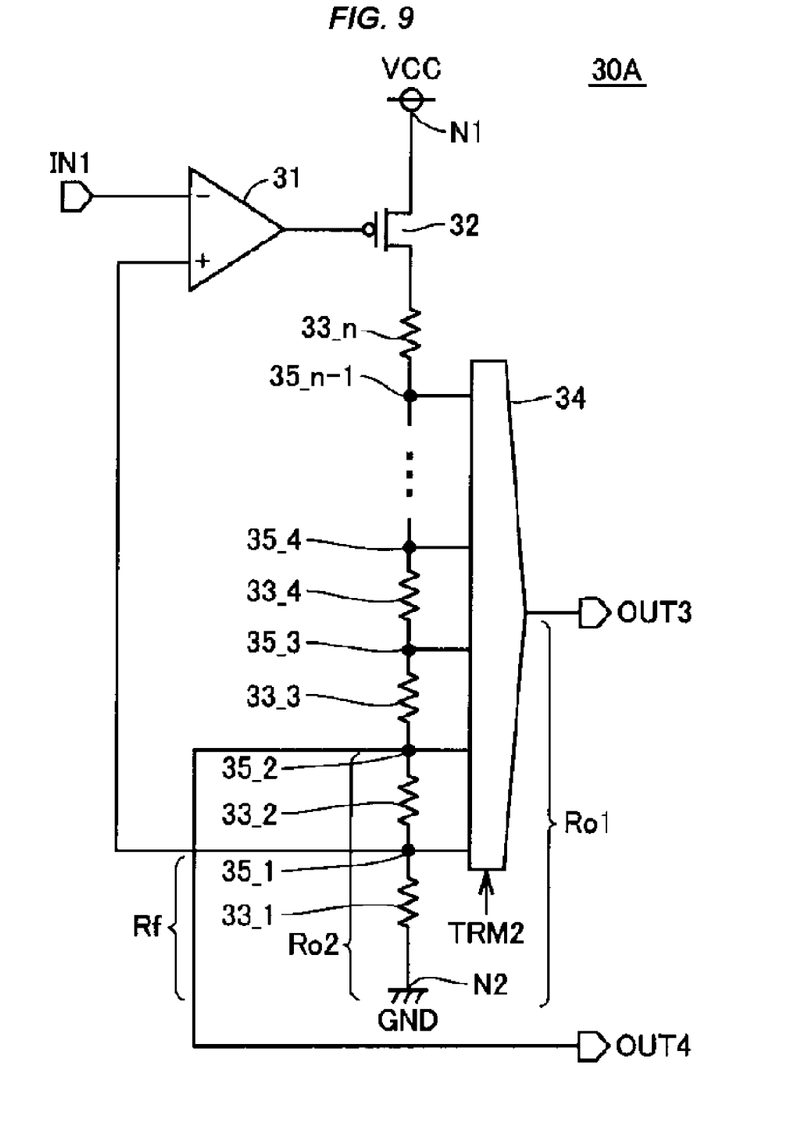
FIG. 9 is a circuit diagram showing a configuration of a voltage down converter 30A in FIG. 7.

FIG. 9 is a circuit diagram showing a configuration of the voltage down converter 30A in FIG. 7. Referring to FIG. 7, FIG. 9, the voltage down converter 30A generates the reference voltages V1* and V2, which are the down-converted external power source voltages VCC, based on the reference voltage V4 input to the input node IN1 and outputs them from the output node OUT3 and an output node OUT4, respectively. The reference voltage V1* is a voltage adjusted according to the trimming code TRM2 and the reference voltage V2 is a voltage that does not depend on the trimming code.

The voltage down converter 30A includes the differential amplifier 31, the PMOS transistor 32, the n (n is an integer not less than 3) resistor elements 33_1 to 33_n, and the selection circuit 34. The resistor elements 33_1 to 33_n are coupled in this order in series between the ground node N2 (ground voltage GND) and the drain of the PMOS transistor 32. The selection circuit 34 outputs the potential of a node (referred to as a selected node) selected by the trimming code TRM2 from among the coupling nodes 35_1 to 35_n−1 of the resistor elements 33_1 to 33_n to the output node OUT3. The inverted input terminal of the differential amplifier 31 is coupled to the input node IN1, the non-inverted input terminal is coupled to a feedback node (in the case of FIG. 9, the coupling node 35_1), which is one of the coupling nodes 35_1 to 35_n−1 of the resistor elements 33_1 to 33_n, and the output terminal is coupled to the gate of the PMOS transistor 32. The source of the PMOS transistor 32 is coupled to the power source node N1 (external power source voltage VCC). The output node OUT4 is coupled to a fixed output node (in the case of FIG. 9, the coupling node 35_2), which is one of the coupling nodes 35_1 to 35_n−1 of the resistor elements 33_1 to 33_n.

In the voltage down converter 30A with the configuration described above, if it is assumed that a resistance value between the selected node and the ground node N2 is Ro1, a resistance value between the fixed output node and the ground node N2 is Ro2, and the resistance value between the feedback node and the ground node N2 is Rf, the voltage (corresponding to the reference voltage V1* in FIG. 7) of the output node OUT3 is Ro1/Rf times the voltage (corresponding to the reference voltage V4 in FIG. 7) of the input node IN1. The voltage (corresponding to the reference voltage V2 in FIG. 7) of the output node OUT4 is Ro2/Rf times the voltage (corresponding to the reference voltage V4 in FIG. 7) of the input node IN1. The resistance value Ro1 can be adjusted by the trimming code TRM2, and thus the precision of the reference voltage V1* after adjustment is higher than the precision of the reference voltage V2.

With the reference voltage generating unit 1B in the third embodiment, in a steady state after the activation of power source, it is possible to output the reference voltage V1* that hardly depends on the manufacturing process, the external power source voltage VCC, or the operating temperature to the flash memory 3 in FIG. 1. On the other hand, it is possible for the reference voltage generating unit 1B to prevent the influence of the variations in the reference voltage V1* resulting from the trimming code TRM2 becoming indefinite at the time of activation of power source by outputting the reference voltage V2 that does not depend on the trimming code TRM2 to the POR circuit 5 in FIG. 1.

Fourth Embodiment

Figure 10:
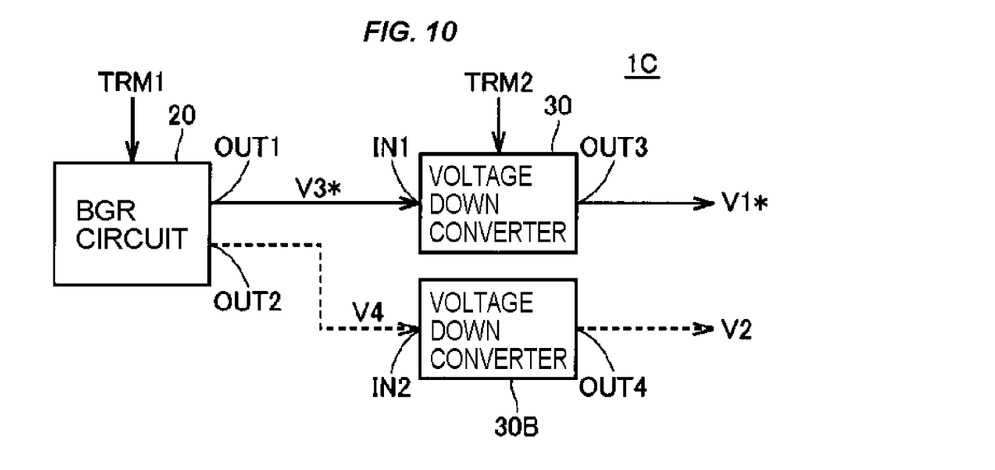
FIG. 10 is a block diagram showing a configuration of a reference voltage generating unit 1C used in a semiconductor device according to a fourth embodiment of the present invention.

FIG. 10 is a block diagram showing a configuration of a reference voltage generating unit 1C used in a semiconductor device according to a fourth embodiment of the present invention. Referring to FIG. 10, the reference voltage generating unit 1C includes the BGR circuit 20 that receives the trimming code TRM1, the voltage down converter 30 that receives the trimming code TRM2, and a voltage down converter 30B that does not depend on the trimming code. The trimming codes TRM1, TRM2 are stored in advance in the flash memory 3 in FIG. 1 and read from the flash memory 3 in response to the control signal CS1 output from the control circuit 6.

The BGR circuit 20 generates the reference voltage V3* adjusted by the trimming code TRM1 and at the same time, generates the reference voltage V4 that does not depend on the trimming code TRM1 or TRM2. The details of the configuration of the BGR circuit 20 are the same as those in FIG. 3, and thus their explanation is not repeated. The reference voltage V3* that is generated is output from the output node OUT1 to the voltage down converter 30 and the reference voltage V4 is output from the output node OUT2 to the voltage down converter 30B.

The voltage down converter 30B generates the reference voltage V1*, which is the down-converted external power source voltage VCC, based on the reference voltage V3* input to the input node IN1 and outputs it from the output node OUT3. The reference voltage V1* that is output is the reference voltage V3* multiplied by a multiplying factor adjusted by the trimming code TRM2. The details of the configuration of the voltage down converter 30 are the same as those in FIG. 6, and thus their explanation is not repeated.

Figure 11:
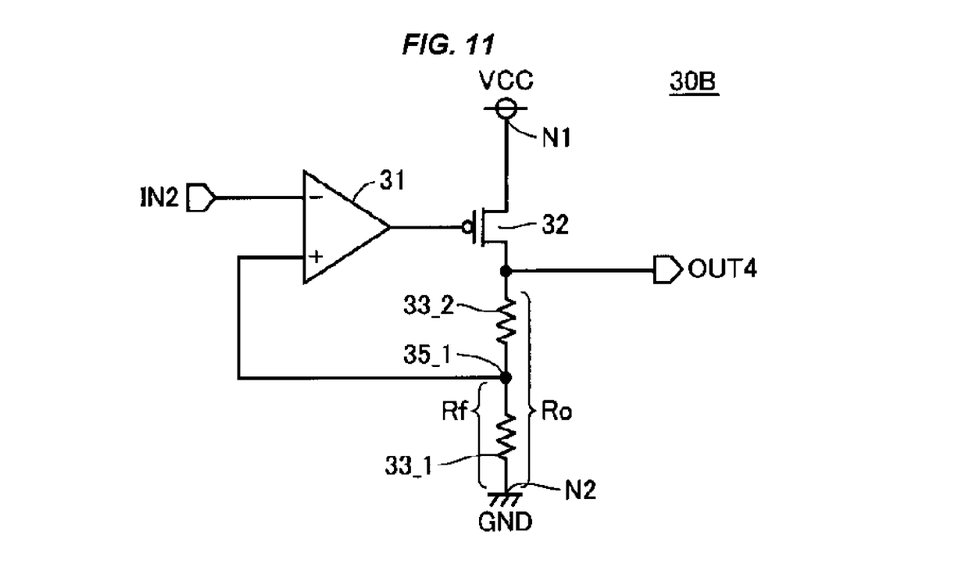
FIG. 11 is a circuit diagram showing a configuration of a voltage down converter 30B in FIG. 10.

FIG. 11 is a circuit diagram showing a configuration of the voltage down converter 30B in FIG. 10. Referring to FIG. 10, FIG. 11, the voltage down converter 30B generates the reference voltages V2, which is the down-converted external power source voltage VCC, based on the reference voltage V4 input to the input node IN2 and outputs it from the output nodes OUT4.

The voltage down converter 30B includes the differential amplifier 31, the PMOS transistor 32, and the resistor elements 33_1 and 33_2. The resistor elements 33_1 and 33_2 are coupled in this order in series between the ground node N2 (ground voltage GND) and the drain of the PMOS transistor 32. The inverted input terminal of the differential amplifier 31 is coupled to the input node IN2, the non-inverted input terminal is coupled to the coupling node 35_1 of the resistor elements 33_1 and 33_2, and the output terminal is coupled to the gate of the PMOS transistor 32. The source of the PMOS transistor 32 is coupled to the power source node N1 (external power source voltage VCC) and the drain is coupled to the output node OUT4.

In the voltage down converter 30 with the configuration described above, if it is assumed that the resistance value between the coupling node 35_1 and the ground node N2 is Rf and the combined resistance value of the resistance elements 33_1 and 33_2 coupled in series is Ro, the voltage (corresponding to the reference voltage V2 in FIG. 10) of the output node OUT4 is Ro/Rf times the voltage (corresponding to the reference voltage V4 in FIG. 10) of the input node IN1. The resistance values Ro, Rf are fixed values that do not depend on the trimming code TRM1 or TRM1.

With the reference voltage generating unit 1C in FIG. 10, in a steady state after the activation of power source, it is possible to output the high precision reference voltage V1* that hardly depends on the manufacturing process, the external power source voltage VCC, or the operating temperature to the flash memory 3 in FIG. 1. On the other hand, it is possible for the reference voltage generating unit 1C to prevent the influence of the variations in the reference voltage V1* resulting from the trimming codes TRM1 and TRM2 becoming indefinite at the time of activation of power source by outputting the reference voltage V2 that does not depend on the trimming code TRM1 or TRM2 to the POR circuit 5 in FIG. 1.

Fifth Embodiment

Figure 12:
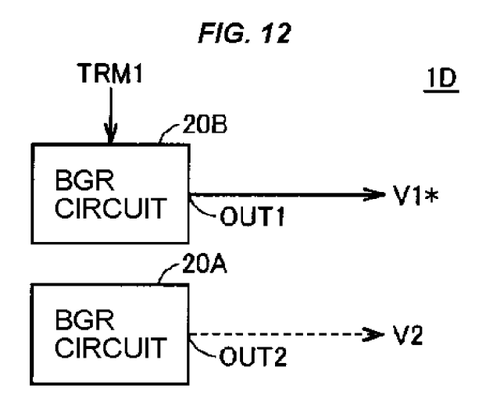
FIG. 12 is a block diagram showing a configuration of a reference voltage generating unit 1D used in a semiconductor device according to a fifth embodiment of the present invention.

FIG. 12 is a block diagram showing a configuration of a reference voltage generating unit 1D used in a semiconductor device according to a fifth embodiment of the present invention. Referring to FIG. 12, the reference voltage generating unit 1D includes two independent BGR circuits 20B and 20A. The BGR circuit 20B generates the reference voltages V1* adjusted in accordance with the trimming code TRM1 and outputs the reference voltages V1* that is generated from the output node OUT1 to the buffer circuit 2 in FIG. 1. The BGR circuit 20A generates the reference voltages V2 that does not depend on the trimming code and outputs the reference voltages V2 that is generated to the POR circuit 5 in FIG. 1. The details of the configuration of the BGR circuit 20A are the same as those in FIG. 8, and thus their explanation is not repeated.

Figure 13:
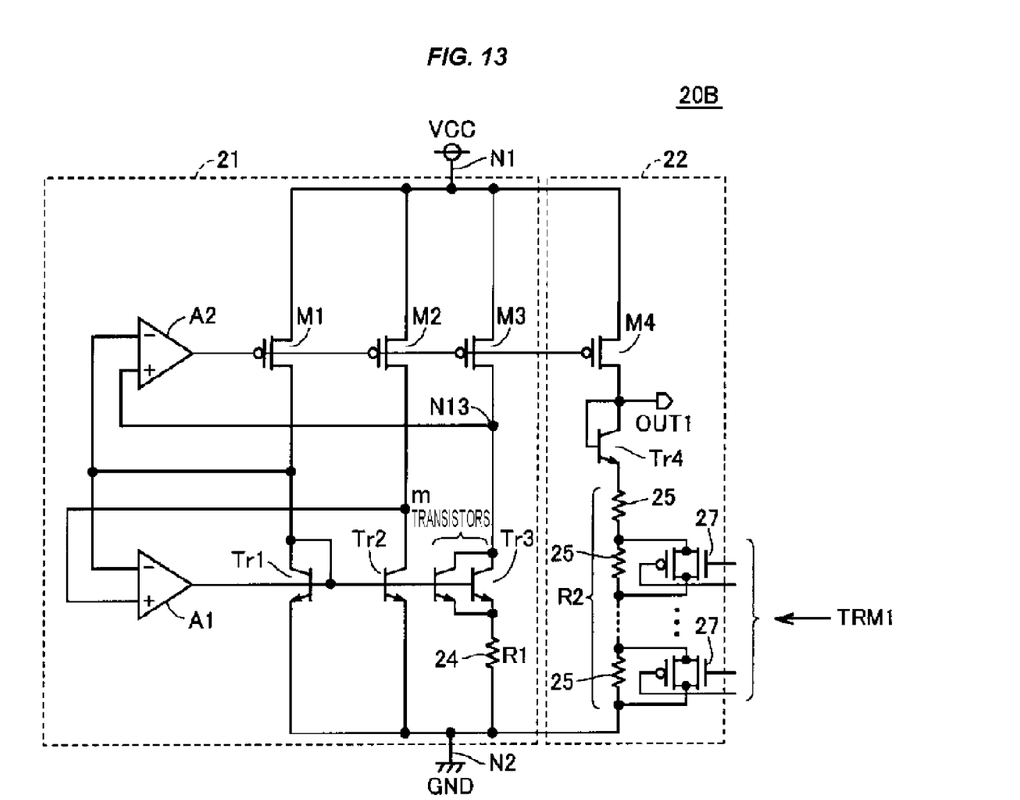
FIG. 13 is a circuit diagram showing a configuration of a BGR circuit 20B in FIG. 12.

FIG. 13 is a circuit diagram showing a configuration of the BGR circuit 20B in FIG. 12. The configuration of the BGR circuit 20B is the same as that of the BGR circuit 20 in FIG. 3 from which the voltage output unit 23 is removed and includes the reference current generating unit 21 and the voltage output unit 22. As for the reference current generating unit 21 and the voltage output unit 22 in FIG. 8, the same reference symbols are attached to the same or corresponding parts as those in FIG. 3 and their explanation is not repeated.

With the reference voltage generating unit 1D in FIG. 12, in a steady state after the activation of power source, it is possible to output the high precision reference voltage V1* that hardly depends on the manufacturing process, the external power source voltage VCC, or the operating temperature to the flash memory 3 in FIG. 1. On the other hand, it is possible for the reference voltage generating unit 1D to prevent the influence of the variations in the reference voltage V1* resulting from the trimming code TRM1 becoming indefinite at the time of activation of power source by outputting the reference voltage V2 that does not depend on the trimming code TRM1 to the POR circuit 5 in FIG. 1.

It should be considered that the embodiments disclosed above are mere illustrations in all the points and not limitative. The scope of the present invention is defined by claims not by the explanations given above and it is intended to include all modifications in the meaning and scope equivalent to those of claims.

What is claimed is:
1. A semiconductor device comprising:
a reference voltage generating unit that generates a first reference voltage adjusted in accordance with trimming data and a second reference voltage that does not depend on the trimming data, based on an external power source voltage;
a nonvolatile memory that operates in accordance with the first reference voltage or a voltage based on the first reference voltage and which stores the trimming data;
a power-on reset circuit that switches the logic levels of a reset signal when the external power source voltage reaches a constant multiple of the second reference voltage at the time of activation of power source; and a control circuit that causes the reference voltage generating unit to read the trimming data stored in the nonvolatile memory in response to the switching of the logic levels of the reset signal, wherein the trimming data includes first and second trimming codes, wherein the reference voltage generating unit includes a band-gap reference circuit that receives the first trimming code and a voltage adjusting circuit that receives the second trimming code, wherein the band-gap reference circuit has a reference current generating unit that generates a reference current that does not depend on the trimming data, a first voltage output unit that generates and outputs a third reference voltage adjusted in accordance with the first trimming code based on the reference current, and a second voltage output unit that generates and outputs the second reference voltage that does not depend on the trimming data based on the reference current, and wherein the voltage adjusting circuit generates the first reference voltage by multiplying the third reference voltage by a multiplying factor adjusted in accordance with the second trimming code.

2. A semiconductor device comprising:

a reference voltage generating unit that generates a first reference voltage adjusted in accordance with trimming data and a second reference voltage that does not depend on the trimming data, based on an external power source voltage;

a nonvolatile memory that operates in accordance with the first reference voltage or a voltage based on the first reference voltage and which stores the trimming data;

a power-on reset circuit that switches the logic levels of a reset signal when the external power source voltage reaches a constant multiple of the second reference voltage at the time of activation of power source; and a control circuit that causes the reference voltage generating unit to read the trimming data stored in the nonvolatile memory in response to the switching of the logic levels of the reset signal, wherein the reference voltage generating unit includes a band-gap reference circuit that generates a third reference voltage that does not depend on the trimming data and a voltage adjusting circuit that receives the third reference voltage, wherein the voltage adjusting circuit generates the first reference voltage by multiplying the third reference voltage by a first multiplying factor adjusted in accordance with the trimming data, and wherein the voltage adjusting circuit generates the second reference voltage by multiplying the third reference voltage by a second multiplying factor that does not depend on the trimming data.

3. A semiconductor device comprising:

a reference voltage generating unit that generates a first reference voltage adjusted in accordance with trimming data and a second reference voltage that does not depend on the trimming data, based on an external power source voltage;

a nonvolatile memory that operates in accordance with the first reference voltage or a voltage based on the first reference voltage and which stores the trimming data;

a power-on reset circuit that switches the logic levels of a reset signal when the external power source voltage reaches a constant multiple of the second reference voltage at the time of activation of power source; and a control circuit that causes the reference voltage generating unit to read the trimming data stored in the nonvolatile memory in response to the switching of the logic levels of the reset signal, wherein the trimming data includes first and second trimming codes, wherein the reference voltage generating unit includes a band-gap reference circuit that receives the first trimming code, a first voltage adjusting circuit that receives the second trimming code, and a second voltage adjusting circuit, wherein the band-gap reference circuit has a reference current generating unit that generates a reference current that does not depend on the trimming data, a first voltage output unit that generates and outputs a third reference voltage adjusted in accordance with the first trimming code based on the reference current, and a second voltage output unit that generates and outputs a fourth reference voltage that does not depend on the trimming data based on the reference current, wherein the first voltage adjusting circuit generates the first reference voltage by multiplying the third reference voltage by a first multiplying factor adjusted in accordance with the second trimming code, and wherein the second voltage adjusting circuit generates the second reference voltage by multiplying the fourth reference voltage by a second multiplying factor that does not depend on the trimming data.

* * * * *